United States Patent [19]
Canteloup et al.

[11] Patent Number: 5,648,849
[45] Date of Patent: Jul. 15, 1997

[54] METHOD OF AND DEVICE FOR IN SITU REAL TIME QUANTIFICATION OF THE MORPHOLOGY AND THICKNESS OF A LOCALIZED AREA OF A SURFACE LAYER OF A THIN LAYER STRUCTURE DURING TREATMENT OF THE LATTER

[75] Inventors: Jean Canteloup, Monthlery; Jacky Mathias, Jargeau, both of France

[73] Assignee: Sofie, Arpajon, France

[21] Appl. No.: 418,137

[22] Filed: Apr. 5, 1995

[30] Foreign Application Priority Data

Apr. 5, 1994 [FR] France ................... 94 03981

[51] Int. Cl.⁶ ................................. G01B 9/02
[52] U.S. Cl. .................. 356/357; 356/346; 356/345
[58] Field of Search .................... 356/345, 357, 356/346

[56] References Cited

U.S. PATENT DOCUMENTS

| | | |
|---|---|---|
| 4,984,894 | 1/1991 | Kondo . |
| 4,988,198 | 1/1991 | Kondo ........................... 356/357 |

FOREIGN PATENT DOCUMENTS

| | | |
|---|---|---|
| 2680414 | 2/1993 | France . |
| 8601591 | 3/1986 | WIPO . |

OTHER PUBLICATIONS

"Fourier-Septrometer for Thickness Measurement", IBM Technical Disclosure Bulletin, vol. 36, No. 12, Dec. 1993, No. 12, Dec. 1993, pp. 49–51.

Kiyoshi et al, "Device for Measuring Film Thickness", Patent Abstracts of Japan, vol. 6, No. 125 (P–127), Jul. 1982 & JP-A–47 052 807.

*Primary Examiner*—Frank G. Font
*Assistant Examiner*—Robert Kim
*Attorney, Agent, or Firm*—Cushman Darby & Cushman Intellectual Property Group of Pillsbury Madison & Sutro LLP

[57] ABSTRACT

A method for in situ quantification of the morphology and the thickness of a localized area of a surface layer of a thin layer structure entails directing a beam of white light and one or two lazer beams onto a sample enclosed in a vacuum treatment chamber, using a monochromator for a spectral analysis of the white light reflected by the sample and/or differential interferometry with a predetermined wavelength to determine the thickness and the instantaneous rate of variation of the thickness of the surface layer of the sample and to display a monochromatic map of the morphology of the localized area obtained by differential interferometry using a matrix camera. One application is controlling vacuum treatment of thin layer structures, especially semiconductors and integrated circuits, monitoring the morphology, thickness and rate of variation of thickness of the surface layer of the treated sample in situ and in real time.

9 Claims, 5 Drawing Sheets

METHOD OF AND DEVICE FOR IN SITU REAL TIME QUANTIFICATION OF THE MORPHOLOGY AND THICKNESS OF A LOCALIZED AREA OF A SURFACE LAYER OF A THIN LAYER STRUCTURE DURING TREATMENT OF THE LATTER

BACKGROUND OF THE INVENTION

1. Field of the Invention

The present invention concerns a method of and a device for quantifying the morphology and measuring the thickness and its evolution of a localized area of a surface layer of a thin layer structure.

The many applications of the invention include in situ real time control of the fabrication of microsystems such as semiconductors, integrated circuits, for example dimensional control for contour extraction, absolute measurement of the thickness of a layer and its rate of growth (deposition) or removal (etching), etc.

2. Description of the Prior Art

U.S. patent application Ser. No. 930,243 describes a compact system for simultaneous laser interferometric measurement and observation for in situ interferometric measurement of a stack of thin layers in a vacuum treatment chamber. The system includes an observation camera with the optical axis of the objective common to a monochromatic illumination beam and one or two interferometric measurement laser beams.

This prior art document discloses a powerful method suitable for controlling the rate of growth or removal of the surface layer of a thin layer structure. It has some imperfections, however. In particular, the monochromatic illumination beam and the inteferometric measurement laser beam do not have exactly the same wavelength which causes achromatism so that the two light beams can be focused simultaneously only if the objectives are achromatic. Also this method does not allow absolute measurement of the thickness of the surface layer in the area under observation, as it is based on differential interferometric measurement which is repeated modulo one period.

U.S. Pat. No. 4,984,894 (KONDO) discloses a technique for measuring the thickness of the surface layer of a multilayer structure. This technique consists in illuminating the structure with a light beam in the visible spectrum or in the ultra violet spectrum to determine the thickness of the surface layer of the structure by spectral analysis of part of the reflected beam. However, this technique is proposed for use on a microscope which cannot be used in situ to measure the thickness of the layers carrying patterns during their fabrication inside a vacuum chamber. The distance between the structure under observation and the objective of the apparatus is relatively large (usually in the order of 10 cm), which means that a microscope cannot be used.

An object of the present invention is to propose an improved technique for remedying the limitations of the aforementioned prior art techniques and to enable in situ real time observation of the morphology and thickness of a localized area of the surface layer of a thin layer structure.

Another object of the invention is to provide an observation device using this technique which is very small so that it can be integrated into existing equipment for the vacuum fabrication technique for complex thin layer structures.

SUMMARY OF THE INVENTION

The method of the invention is for in situ real time observation of the morphology and thickness of a localized area of the surface layer of a thin layer structure. The thin layer structure is enclosed in a vacuum treatment chamber including a transparent porthole or observation window. The method of the invention consists in: directing an illumination light beam in a predetermined spectrum and at least one laser beam onto the localized area, the beams following a common optical path centered on the optical axis of the objective of an observation camera and passing through the porthole of the vacuum chamber to impinge on the localized area; directing the light beam reflected by the localized area and following said common optical path towards the matrix sensor of the camera via a filter the characteristic wavelength of which is close to the wavelength of the laser beam to show a map of the localized area by monochromatic differential interferometry, the localized area being centered on the laser spot, and to a monochromator via a selector diaphragm, a fiber optic cable and an analyzer slit at the monochromator entry in succession; using the monochromator for spectral analysis of the reflected light beam to determine the thickness of the surface layer in the localized area and/or differential interferometry with a predetermined wavelength to measure the variation of the thickness of the surface layer in the localized area.

The laser beam is used to center the illumination beam on the localized area and to center the selection diaphragm, the aperture of which is predetermined or variable to define an image plane at the entry of the fiber optic cable for the monochromator. It is also used to focus the light beam on the sample by measuring its intensity. The image plane is defined according to the optical characteristics of the objective of the camera, the morphology of the localized area (comprising only a representative part of the surface layer under observation by exclusion of adjacent parts other than the layer concerned) and the signal to noise ratio for the signals from the monochromator.

The entry slit of the monochromator is determined according to the characteristics of the monochromator, the diameters and the disposition of the optical fibers and the aperture of the selection diaphragm.

The spectral analysis of the reflected beam gives the thickness of the surface layer in the area under observation. In practise this is possible only for surface layer thicknesses beyond a threshold value that depends on the shortest wavelength of the spectrum of the illumination light beam. It is possible to reduce the minimum spectral analysis threshold value by choosing an illumination beam spectrum the shortest wavelength of which is shifted towards the ultra violet.

However, the objective of the observation camera is made from optical lenses which have good optical characteristics in the visible spectrum but poor characteristics in the ultra violet spectrum. Displacing the illumination spectrum towards the ultra violet is therefore not allowed beyond a particular optical limit of the objective used. In this case the invention provides a parallel optical path using an additional module described below.

In accordance with the invention, a specific wavelength is chosen in the spectrum of the illumination light beam and differential interferometry is used to examine the evolution of the luminous intensity at this specific wavelength. This determines accurately the variation in time of the thickness of the surface layer of the sample. This technique allows very accurate monitoring of the evolution of the thickness of the surface layer of the sample, especially during plasma etching or chemical vapor phase deposition of the surface layer.

The combination of spectral analysis and differential interferometry allows real time determination of the absolute thickness of the surface layer of the sample and the instantaneous rate of variation of this thickness.

The differential interferometry can be carried out at the wavelength of the laser beam because of its high intensity which ensures a high signal to noise ratio which enables an accurate analysis. It is then preferable to choose the wavelength of the laser beam at one end of the spectrum of the illumination light beam so as not to disturb the spectral analysis that can be carried out at the same time, for example on the same detector. The spectrum of the illumination light beam overlaps at least part of the visible spectrum (wavelengths between 400 nm and 800 nm) to enable good visual observation by the camera which supplies a differential interferometric map of the localized area of the sample.

The invention will be better understood from a study of the detailed description of one embodiment of the invention given by way of non-limiting example only and shown in the appended drawings.

DETAILED DESCRIPTION OF THE PREFERRED EMBODIMENTS

We have developed a very compact system for simultaneous observation and interferometric measurement by laser, in particular on thin layer structures, by a technique described in detail in U.S. patent application Ser. No. 930,243. The apparatus and the device described by way of illustrative example of the present invention have many points in common with those developed previously by us. For this reason the reader is invited to refer to U.S. patent application Ser. No. 930,243 for further details of the apparatus and the device.

Figure 1:
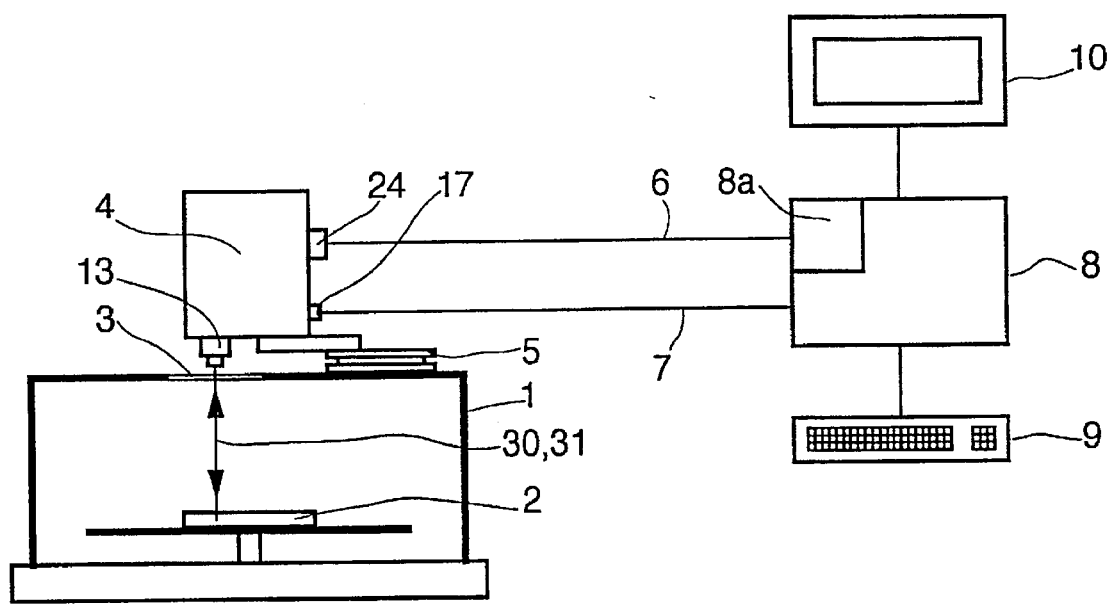
FIG. 1 is a diagram explaining the apparatus used in one particular application of the method of the invention.

As shown in FIG. 1, a vacuum treatment chamber 1 contains a sample 2 to be treated, for example an integrated circuit wafer in the process of fabrication by plasma etching, and has a silica window 3 in its top surface. An observation unit 4 is mounted above the treatment chamber 1 on a horizontal X-Y displacement table 5. The observation unit 4 is connected by a fiber optic cable 6 and an electric cable 7 to an operating and control unit 8 associated with a control keypad 9 and a display screen 10. The unit 8 is connected to two electric stepper motors (not shown) for horizontal displacemant of the observation unit 4 on the table 5.

Figure 2:
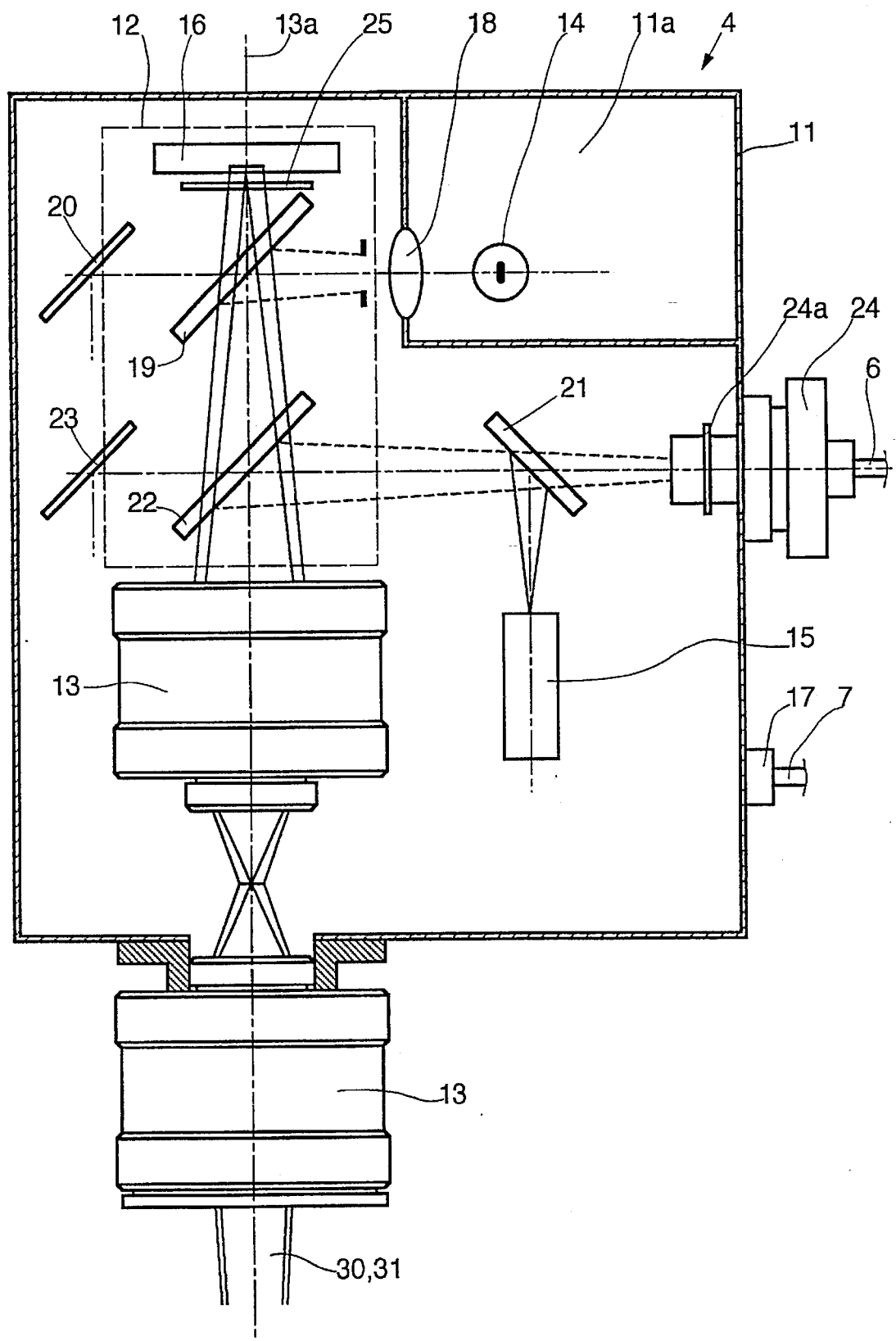
FIG. 2 is a diagram explaining the device of the invention.

As shown in more detail in FIG. 2, the observation unit 4 has a casing 11 which contains a video camera 12 the adjustable objective 13 of which can be of the autofocusing type, an illumination source 14, a laser 15 and a number of optical plates for guiding the light beams along predetermined optical paths.

The video camera 12 includes a sensor 16 that is preferably in the form of a plurality of charge transfer (CCD) cells arranged in a matrix. The sensor 16 is connected in a manner that is not shown to an electric connector 17 for the electric cable 7 to supply a video signal to the operating and control unit 8 where it is displayed on the screen 10, the electric connector 17 being mounted on the casing 11.

The casing 11 has an interior compartment 11a containing the illumination source 14 the emission spectrum of which preferably overlaps at least part of the visible spectrum. To simplify the following description the light emitted by the illumination source 14 will be called white light. The interior compartment 11a has a window fitted with an optical lens 18 which directs the illumination light beam towards a beam-splitter plate 19 disposed between the objective 13 and the sensor 16 of the camera 12, so that the illumination light beam follows the optical path of the camera, i.e. the optical axis 13a of the objective 13. A first light trap plate 20 is disposed behind the beam-splitter plate 19 to absorb the part of the illumination light beam that passes through the beam-splitter plate 19 and so reduce optical interference in the observation unit 4.

The laser 15 can be a laser diode as shown in FIG. 2 or two separate laser diodes (not shown). The laser beam from the laser 15 is projected via a beam-splitter plate 21 onto another beam-splitter plate 22 on the optical path between the objective 13 and the sensor 16 of the camera 12 so that the laser beam also follows the optical path of the camera 12 which is coincident with the optical axis 13a of the objective 13. Another light trap plate 23 is placed behind the beam-splitter plate 22 to absorb stray light rays in the casing 11 of the observation unit 4.

The compact casing 11 of the observation unit 4 thus contains the video camera 12 with the illumination source 14 and the laser 15 and is adapted to emit a light beam comprising the illumination light beam produced by the illumination source 14 and the laser beam emitted by the laser 15 on a common optical path which is coincident with the optical axis 13a of the objective 13 of the camera 12. The Combined light beam is directed by the observation unit 4 via the objective 13 and the window 3 of the treatment chamber 1 to impinge on the thin layer structure sample 2 (see FIG. 1). The light beam reflected by the sample 2 follows the same common optical path as the incident light beam and passes through the objective 13 (FIG. 1) into the casing 11 of the observation unit 4. The beam-splitter plate 22 splits the reflected beam into two parts. A transmitted part passes through the beam-splitter plates 22 and 19 to the sensor 16 of the camera 12. A part reflected by the beam-splitter plate 22 passes through the beam-splitter plate 21 to a fiber optic cable 6 via an optical connector 24 mounted on the casing 11 of the observation unit 4.

The reflected beam directed towards the sensor 16 of the camera 12 has a spectrum corresponding to that of the illumination light beam with a high intensity reflected laser beam. To prevent the reflected laser beam dazzling the sensor 16 (and therefore the video camera 12) a filter 25 is placed on the optical path of the camera 12 just in front of the sensor 16. The optical filter 25 is transparent at a characteristic wavelength and opaque at other wavelengths and so transmits virtually monochromatic light to the sensor 16 of the camera 12. Each CCD cell of the sensor 16 therefore behaves as an individual interferometer representing one pixel in the image plane of the camera 12. As a result the video camera 12 behaves as a plurality of interferometers in a matrix arrangement and therefore supplies a video signal displayed on the screen 10 as a monochromatic map of the surface morphology of the illuminated localized area of the sample 2. The characteristic wavelength of the optical filter 25 is preferably close enough to the wavelength of the laser beam(s) for the screen 10 also to show the laser spot(s) inside the illuminated localized area without this dazzling the video camera 12.

The optical connector 24 receives part of the reflected beam and passes it to the operating and control unit 8 via the fiber optic cable 6. The connector 24 includes a selection diaphragm 24a the aperture of which is predetermined of variable to determine an image plane corresponding to only part of the illuminated localized area of the sample 2 for purposes of analysis.

Figure 3A:
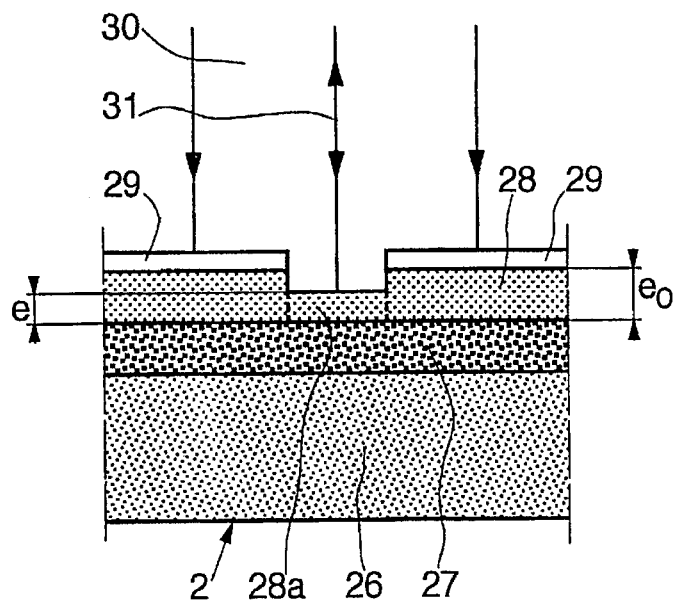
FIGS. 3a and 3b are diagrammatic detailed views of the localized area of the sample under observation by the technique of the invention.
Figure 3B:
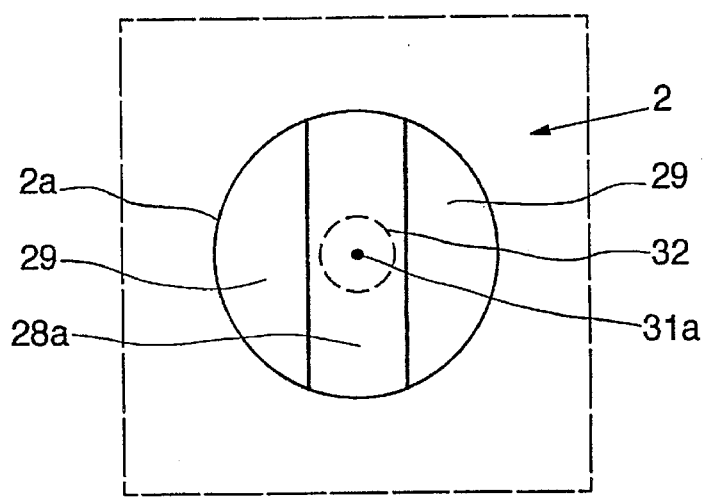
Figure 3C:
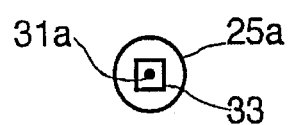
FIG. 3c is a diagram showing the disposition of images representative of the invention.

FIGS. 3a to 3c are diagrams showing a few images representative of the method of the invention. The sample 2 to be processed is a thin layer structure used to fabricate integrated circuits by plasma etching or deposition. The sample 2 has a silicon substrate 26, a sublayer 27 covering the substrate 26 and a silicon oxide surface layer 28 in which the integrated circuit is etched subsequently. To this end, parts of the surface layer 28 are protected by a mask 29. The area 28a of the surface layer 28 not protected by the mask 29 is plasma etched (a known technique) to a predetermined thickness.

The incident light beam emitted by the observation unit 4 illuminates a localized area 2a on the top surface of the sample 2. The localized area 2a is delimited by the white light illumination light beam 30. The laser beam 31 is concentric with the illumination beam 30 and enables the latter to be positioned accurately on the sample 2.

As previously described, a monochromatic map of the illuminated localized area 2a of the sample 2 (delimited by the usable area of the camera) is established in real time by the video camera 12 and simultaneously displayed on the screen 10. The morphology of the illuminated localized area 2a and its evolution can therefore be observed in real time before and during plasma etching of the sample 2 and real time control of the dimensions of the patterns in the illuminated localized area 2a can be effected by counting pixels and adjusting luminous intensity thresholds of the video camera 12. The laser spot 31a (FIG. 3b) on the exposed part 28a of the surface layer 28 of the sample 2 can be seen on the monochromatic map established by the video camera 12.

Figure 4:
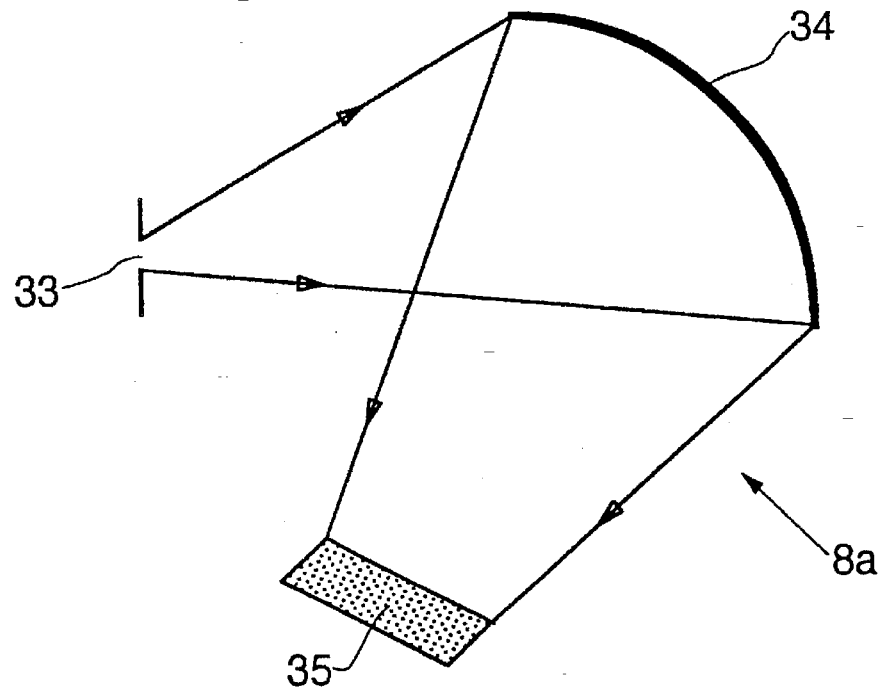
FIG. 4 shows the operating principle of the monochromator.

A monochromator 8a in the operating and control unit 8 is described now with reference to FIG. 4. To be representative, the light beam sent to the monochromator 8a for analysis must be limited to a specific area 32 (FIG. 3b) representative of the sample 2. Plasma etching of the sample 2 requires observation of the thickness c of the variation of thickness Δe [sic] of the unprotected part 28a of the surface layer 28. The specific analysis area 32 must then be inside the part 28a excluding the parts covered by the mask 29. The specific analysis area 32 is preferably centered on the laser spot 31a, this area being delimited by the selection diaphragm 24a at the entry of the optical connector 24. The aperture of the selection diaphragm 24a is determined on the basis of the magnification of the objective 13, the distance between the objective 13 and the exposed area 28a of the surface layer 28 of the sample 2 and the signal to noise ratio of the signal from the monochromator 8a. The image plane of the monochromator 8a defined by the analysis slit 33 corresponds to the specific analysis area 32 on the sample 2.

FIG. 3c shows the laser spot 31a, the aperture 25a of the selection diaphragm 24a centered on this spot and an analysis slit 33 at the entry to the monochromator 8a. Between this selection diaphragm 24a and the analysis slit 33 is the fiber optic cable 6 which conveys the light beam reflected from the specific analysis area 32 of the sample 2 to the monochromator 8a.

As shown in FIG. 4, the light beam that enters the monochromator 8a via the analysis slit 33 is projected onto a plane field diffraction grating 34. A photosensitive component 35 which can be in the form of a strip of n CCD photodiodes (1 024 diodes, for example) or a matrix of CCD diodes with m rows and n columns. For a CCD diode strip in which each diode is 25 μm by 25 μm the analysis slit can be 25 μm by 25 μm or slightly larger.

Figure 5A:
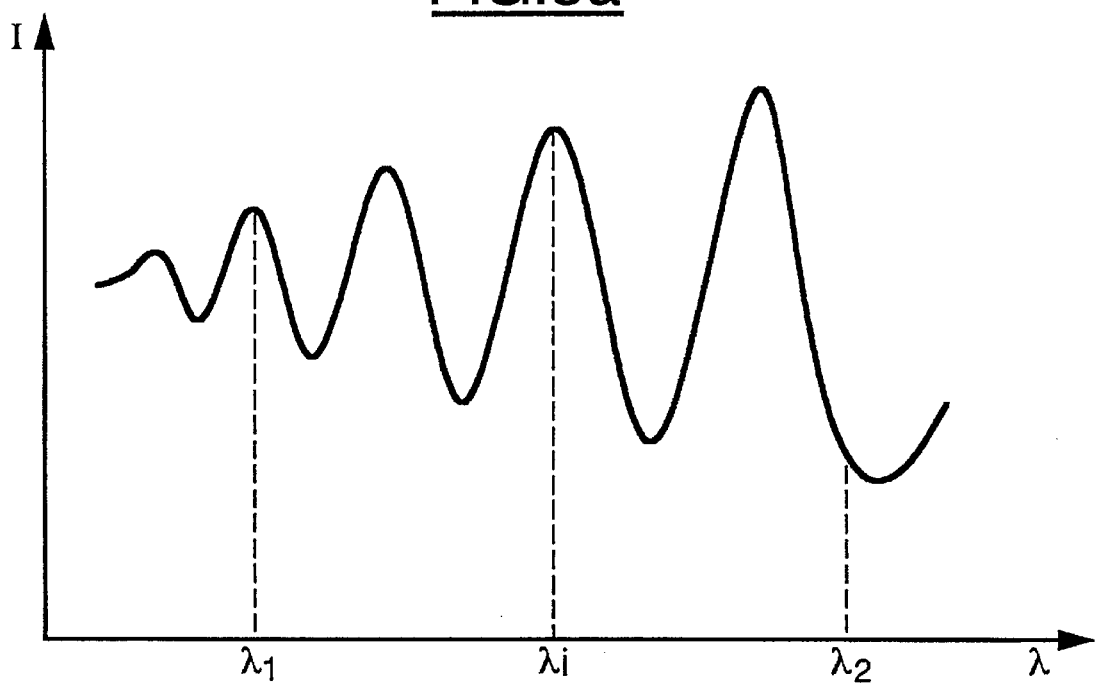
FIGS. 5a and 5b are diagrams showing the spectral analysis and differential interferometry curves, respectively.

The photosensitive component 35 gives the luminous intensity for each wavelength λ of the illumination beam spectrum. As shown in FIG. 5a, the spectrum analyzed is delimited by a minimal wavelength $\lambda_1$ and a maximal wavelength $\lambda_2$. The spectral analysis of the diagram from FIG. 5a gives the instantaneous thickness e of the exposed part 28a of the surface layer 28 of the sample 2 accurately.

Figure 5B:
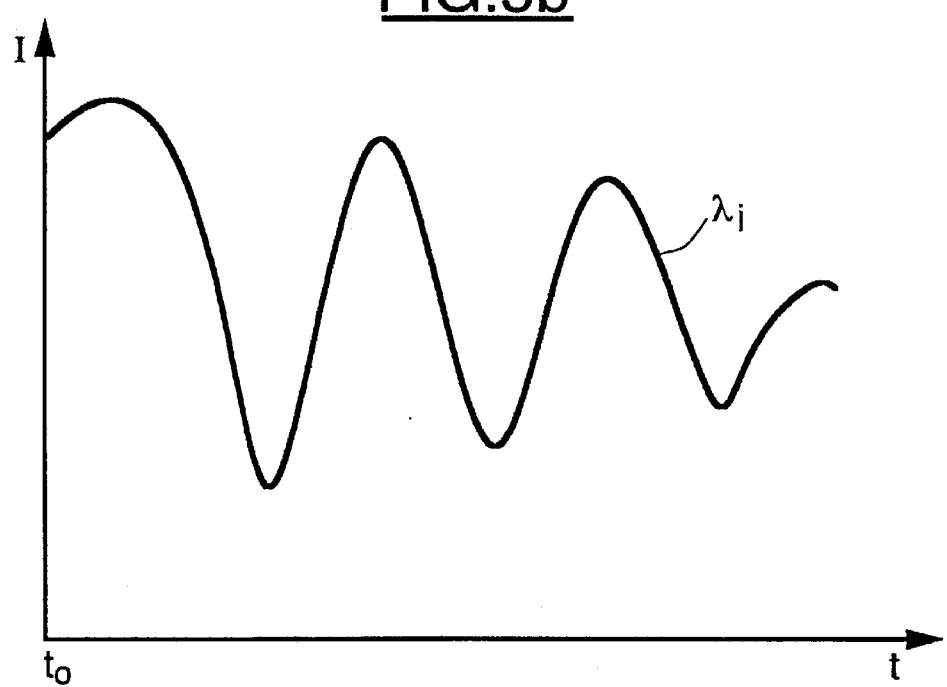

At the same time as or after the spectral analysis, differential interferometry can be carried out using a predetermined wavelength $\lambda_i$ in the illumination beam spectrum (FIG. 5b). The analysis of the diagram of luminous intensity as a function of time for the predetermined wavelength $\lambda_i$ (FIG. 5b) gives in a manner that is known per se the rate of variation of the thickness in the exposed area 28a of the surface layer 28 of the sample 2 during plasma etching.

Because of its high energy, the laser beam reflected by the sample 2 can be used for the differential interferometric analysis (FIG. 5b) by the monochromator 8a. To avoid disturbing the spectral analysis the laser preferably emits at a wavelength at one end of the illumination beam spectrum. A specific area can be formed electronically in a known manner on the photosensitive component 35 of the monochromator to enable differential interferometric analysis of the laser beam. This specific area preferably has a luminous intensity attenuating coating.

The invention allows real time monitoring of the absolute thickness (by spectral analysis) and the instantaneous rate of variation of the thickness (by differential interferometric analysis) of the unprotected area 28a of the surface layer 28 of the sample 2 during plasma etching, for example, and simultaneous display of the monochromatic map of the localized area 2a on the sample 2.

The invention naturally applies to other forms of vacuum processing of than layer structures to monitor the morphology and the thickness to the surface layer of the sample under treatment in real time and in situ.

Figure 6:
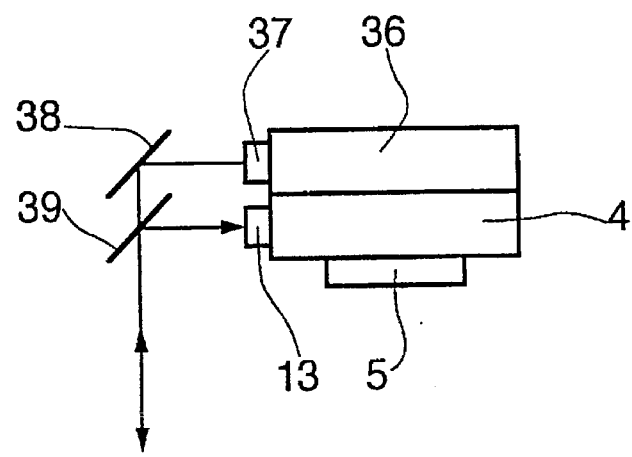
FIG. 6 is a diagram showing a different embodiment of the device of the invention.

FIG. 6 is a diagram showing a variant of the device previously described when the standard observation unit 4 is insufficient to fulfil its role, in particular if the wavelengths used are incompatible with the optical properties of the components (camera objective, beam-splitter plates) or if the material analyzed has insufficient analysis or absorption sensitivity. In these extreme cases an additional module 36 is fitted to the casing 11 of the standard observation unit 4.

The additional module 36 operates in parallel with and complements the unit 4. A high luminescence xenon illumination source which emits a continuum in the ultra violet spectrum can be used, for example. This may be incompatible with the standard unit 4 because of the heat generated and because it is incompatible with the objective 13 of the camera 12. The xenon illumination source in the additional module 36 emits an additional illumination beam in the ultra violet spectrum (wavelengths between 200 nm and 450 nm).

The additional illumination beam passes through a special quartz objective 37 and is directed onto the sample to be analyzed by beam-splitter plates 38 and 39. The standard observation unit 4 also emits a light beam, as previously described, which impinges on the sample to be analyzed via the beam-splitter plate 39, following the same optical path as the additional illumination beam. The reflected light beam is split into one part for the standard observation unit 4, in particular for displaying the map showing the morphology of the sample, and another part for the additional module 36 which is connected via an optical connector (not shown) to the fiber optic cable 6 which is unplugged from the optical connector 24 of the standard observation unit 4 (FIG. 2). The monochromator then carries out the spectral analysis in the ultra violet spectrum and also the differential interferometric analysis, as described previously.

The additional module is also needed if it is necessary to use laser beams which are not compatible with the display optics of the standard observation unit 4.

There is claimed:

1. A method of in situ real time observation of the morphology and thickness of a localized area of a surface layer of a thin layer structure sample enclosed in a vacuum treatment chamber including a window on a top wall, said localized area including a specific analysis area, which method comprises the following steps:

directing an illumination light beam in a predetermined spectrum and at least one laser beam onto said localized area, said beams following a common optical path centered on the optical axis of the objective of a video camera, said video camera containing a matrix sensor, and passing through said window of said treatment chamber to impinge on said localized area, and said laser beam having a predetermined wavelength;

directing the light beam reflected by said localized area and following said common optical path firstly to the matrix sensor of said video camera via a filter to show a monochromatic map of said localized area by differential interferometry, said filter having a characteristic wavelength close to said wavelength of said laser beam, and secondly to a monochromator via a selector diaphragm, a fiber optic cable and an analyzer slit at the monochromator entry, in succession;

delimiting said specific analysis area by means of the aperture of said selector diaphragm to exclude in said localized area the parts that are not representative of said surface layer of said sample for the purposes of analysis;

measuring a thickness of said surface layer in said specific analysis area by spectral analysis, wherein a first intensity of said reflected light beam directed secondly to said monochrometer is measured with said monochrometer at a plurality of wavelengths such that a number of interference maxima and minima are determined between a first measurement wavelength end and a second measurement wavelength end such that spectral analysis provides a measure of said thickness of said surface layer in said specific analysis area; and measuring a rate of change of said thickness of said surface layer in said specific analysis area, wherein a second intensity of said reflected light beam directed firstly to said matrix sensor is measured at a plurality of times such that differential interferometry with a predetermined narrow wavelength region provides a measure of the rate of change of said thickness of said surface layer in said specific analysis area.

2. The method according to claim 1 further comprising simultaneously or successively effecting said spectral analysis and said differential interferometry of the light beam reflected by said specific analysis area of said sample.

3. The method according to claim 1, further comprising directing an illumination light beam in a spectrum overlapping at least part of the visible light spectrum.

4. The method according to claim 1 wherein the wavelength of said laser beam is chosen as the predetermined wavelength for said differential interferometry of said specific analysis area of said sample.

5. The method according to claim 1 wherein the wavelength of said laser beam is at one end of the spectrum of said illumination light beam.

6. An apparatus for in situ real time observation of the morphology and thickness of a localized area of a surface layer of a thin layer structure sample enclosed in a vacuum treatment chamber comprising:

an observation unit comprising:

a compact casing enclosing a video camera for observing a change in thickness of a thin layer structure at a plurality of specific analysis areas on said surface layer, a polychromatic illumination source for producing interference between incident and reflected light at a plurality of wavelengths, a laser for producing interference between incident and reflected light in a predetermined narrow wavelength region for differential interferometry, and optical components;

an operating and control unit including a monochromator for measuring intensity of reflected light at a plurality of wavelengths for spectral analysis;

an optical connector and an electrical connector mounted on said casing of said observation unit to connect it via a fiber optic cable and an electric cable to said operating and control unit;

a control keypad and a display screen connected to said operating and control unit; and a table disposed above said treatment chamber firstly for horizontal displacement of said observation unit along two axes to choose said localized area and for accurate positioning so that the incident light beam and the light beam reflected by said sample follow a common optical path;

wherein said vacuum treatment chamber includes a window on a top wall, and wherein said localized area includes a specific analysis area.

7. The apparatus according to claim 6 wherein said optical connector includes a selector diaphragm that is removable or the aperture of which is variable.

8. The apparatus according to claim 6, wherein said monochromator comprises a strip of charge coupled device diodes and an inlet analyzer slit, the aperture of which is slightly larger than or the same size as a diode from said strip.

9. The apparatus according to claim 6 further comprising an additional module removably mounted on said casing of said observation unit enabling use of at least one of an illumination light beam and a laser beam incompatible with the optical characteristics of said observation unit, beam splitter plates to guide the light beams from said observation unit and said additional module in a common optical path towards said sample.

* * * * *